THIN FILM TRANSISTOR

Filed Dec. 26, 1963 2 Sheets-Sheet 1

INVENTORS
RUDOLPH R. HAERING
MARK G. MIKSIC
WILLIAM B. PENNEBAKER
BY
S. P. Tedesco
ATTORNEY Nov. 29, 1966 R. R. HAERING ETAL 3,289,053

THIN FILM TRANSISTOR

Filed Dec. 26, 1963 2 Sheets-Sheet 2

United States Patent Office 3,289,053

Patented Nov. 29, 1966

3,289,053

THIN FILM TRANSISTOR

Rudolph R. Haering, Kitchener, Ontario, Canada, and Mark G. Miksic, Yorktown Heights, and William B. Pennebaker, Ossining, N.Y., assignors to International Business Machines Corporation, New York, N.Y., a corporation of New York Filed Dec. 26, 1963, Ser. No. 333,279
13 Claims. (Cl. 317—235)

This invention relates to improved electrical circuit devices formed of thin metallic laminates and, more particularly, to thin film transistors and novel methods for fabricating the same.

Due to the increased complexity and also objectionable costs of present day electronic systems, considerable effort is being expended to develop new solid-state components adapted for batch fabrication techniques. By batch fabrication is meant that large numbers of the circuit components as well as the electrical interconnections to form circuit arrays are formed concurrently onto a substrate. It is anticipated that batch fabrication techniques will provide very substantial reductions in the unit cost of the solid-state circuit components as well as the electronic systems.

The scientific literature is replete with descriptions of new solid-state electrical components being developed by industry. A recent solid-state component has been described, for example, by P. K. Weimer, "The TFT—A New Thin-Film Transistor," Proceedings of the I.R.E., June 1962. The operation of this new solid-state device, described as a field-effect device, closely approximates that of a conventional vacuum tube triode since "working currents" are supported only by majority carriers. It differs from the conventional "field-effect" transistor as described, for example, by W. Shockley, "A Unipolar Field Effect Transistor," Proceedings of the I.R.E., pages 1365 through 1376, November 1962, in that a metallic electrode spaced from a semiconductor layer by a thin dielectric film defines the control gate electrode in lieu of a reverse biased "pn" junction.

Basically, the thin film transistor described by Weimer comprises a thin layer of semiconductor material deposited between metallic source and drain electrodes; in addition, a control gate electrode insulated from the semiconductor, or active, layer by a thin, or first, dielectric film is registered in field-applying relationship with the source-drain gap. The operation of a thin film transistor device is based on the modulation of the majority carried volume density in the active semiconductor layer by electrical fields generated by the control gate bias voltage. When the control gate electrode is biased, majority carriers are drawn into the active semiconductor layer from the source and drain electrodes whereby the carrier concentration, and hence conductivity, at the surface of the active layer is modulated.

In effect, the control gate electrode and the active semiconductor layer form a capacitor, carrier concentration in the active layer being a function of control gate bias voltages. Since the active semiconductor layer is polycrystalline, thin film transistors and, also, metallic interconnections therebetween to form circuit arrays can be fabricated by standard vapor deposition techniques.

In addition to simplified fabrication techniques, the operational speeds of the new solid-state circuit components are important. Heretofore, it has not been possible to reproduce a thin film transistor having near-maximum, or theoretically optimum, speeds, i.e., gain-bandwidth product, by known vapor deposition techniques. For example, a very significant problem has been effecting a precise registration of the control gate electrode and the source-drain gap; registration tolerances are very severe because of the microminiature dimensions of thin film transistors. Slight misregistration of the control gate electrode and the source-drain gap has significant effects on the operation of the thin film transistor. For example, any overlapping of the control gate electrode and the source or drain electrodes introduces spurious capacitance $C_s$ which substantially limits the gain-bandwidth product. Gain-bandwidth product is a figure of merit which indicates maximum useable signal frequency, i.e., that frequency where capacitive feed through is equal to the amplified signal output. In circuit applications thin film transistors would normally be designated to operate at a frequency which is a decade below the gain-bandwidth product. Although elaborate techniques have been attempted to effect precise registration of the control gate electrode such attempts have not been consistently successful to achieve sufficient reproducibility.

An object of this invention is to provide a novel method for fabricating electrical circuit devices formed of thin film laminates, e.g. thin film transistors.

Another object of this invention is to provide a method for fabricating thin film transistors having large gain-bandwidth products.

Another object of this invention is to loosen registration problems associated with vapor deposition processes for fabricating thin film transistors so as to increase reproducibility.

Another object of this invention is to provide a novel process for fabricating thin film transistors having minimal spurious capacitance $C_s$ so as to optimize gain-bandwidth product.

Another object of this invention is to provide a novel thin film transistor structure suitable for fabrication by known vapor deposition techniques and wherein spurious capacitance is minimal.

These and other objects and advantages are achieved in accordance with certain aspects of this invention by depositing a second or addition dielectric layer intermediate only the overlapping portions or surfaces of the control gate electrode and the source and drain electrodes, respectively. The second dielectric layer can be congruous with the source-drain electrode pattern and, preferably, deposited through the same source-drain pattern-defining mask. By forming the second dielectric layer of sufficient thickness, capacitance between overlapping portions of the control gate electrode and source or drain electrodes is minimal and an optimum gain-bandwidth product is achieved. In accordance with more particular aspects of this invention, the second dielectric layer and the source and drain electrodes are deposited through a same pattern-defining mask during successive steps of the process whereby re-registration of such mask is avoided.

Normally, the gain-bandwidth product of a thin film transistor is defined as $g_m/C_g+C_s$, where $g_m$ is the transconductance, and $C_g$ is the capacitance between control gate electrode and the active semiconductor layer. Also, transconductance $g_m$ is defined as $dI_{sd}/dV_g$, where $I_{sd}$ is the current along the active semiconductor layer and between the source and drain electrodes and $V_g$ is control gate bias voltage. A maximum gain-bandwidth product, given by $g_m/C_g$, is only obtained when spurious capacitance $C_s$ is reduced to zero as, for example, when control gate electrode and the source-drain gap are in precise registration. Gain-bandwidth product is not affected by changes in control gate-active layer capacitance $C_g$ since $g_m$ is proportional to this quantity; normally, capacitance $C_g$ is selected to achieve a desired transconductance $g_m$. From the definition of gain-bandwidth product, it follows that a maximum gain-bandwidth product is achieved when the ratio $C_s/C_g$ is minimized. Prior art attempts to minimize the ratio $C_s/C_g$ by precise registration of the control gate electrode, although theoretically possible, have not been practically successful.

The fabrication of thin film transistors is further complicated in that a first dielectric layer, determinative of capacitance $C_g$, is normally deposited intermediate the control gate electrode and the active semiconductor layer. Since the transconductance $g_m$ of the thin film transistor device is proportional to the control gate-active layer capacitance $C_g$, a high dielectric constant material is often employed for such layer. However, the same dielectric layer would extend between overlapping portions of the control gate electrode and the source and drain electrodes and accordingly provide a high spurious capacitance $C_s$. The second dielectric layer, since deposited independently of the first dielectric layer, can be formed of a low dielectric constant material and of sufficient thickness to substantially eliminate the spurious capacitance $C_s$. Accordingly, severe overlap of the control gate electrode and the source and drain electrodes introduces, at most, only minimal spurious capacitance $C_s$. As a corollary, the first dielectric layer between the control gate electrode and the active semiconductor layer is formed of high dielectric constant material (1) to further increase the gain-bandwidth product, i.e., $C_s/C_g$ is minimized, and (2) to provide a large transconductance $g_m$.

Also, the provision of a second dielectric layer substantially reduces the possibility of shorts between overlapping portions of the control gate electrode and the source and drain electrodes. The incidence of shorts through a thin dielectric layer is a function of both area and thickness of such layer. In the prior art, the thickness and dielectric constant of the first dielectric layer were necessarily a compromise to avoid shorts and, also, provide the desired transconductance $g_m$ while minimizing spurious capacitance $C_s$. Accordingly, the presence of the thick second dielectric layer substantially reduces the possibility of shorts between overlapping portions of the control gate electrode and the source or drain electrodes.

The foregoing and other objects, features, and advantages of the invention will be apparent from the following more particular description of preferred embodiments of the invention, as illustrated in the accompanying drawings.

Figure 3:
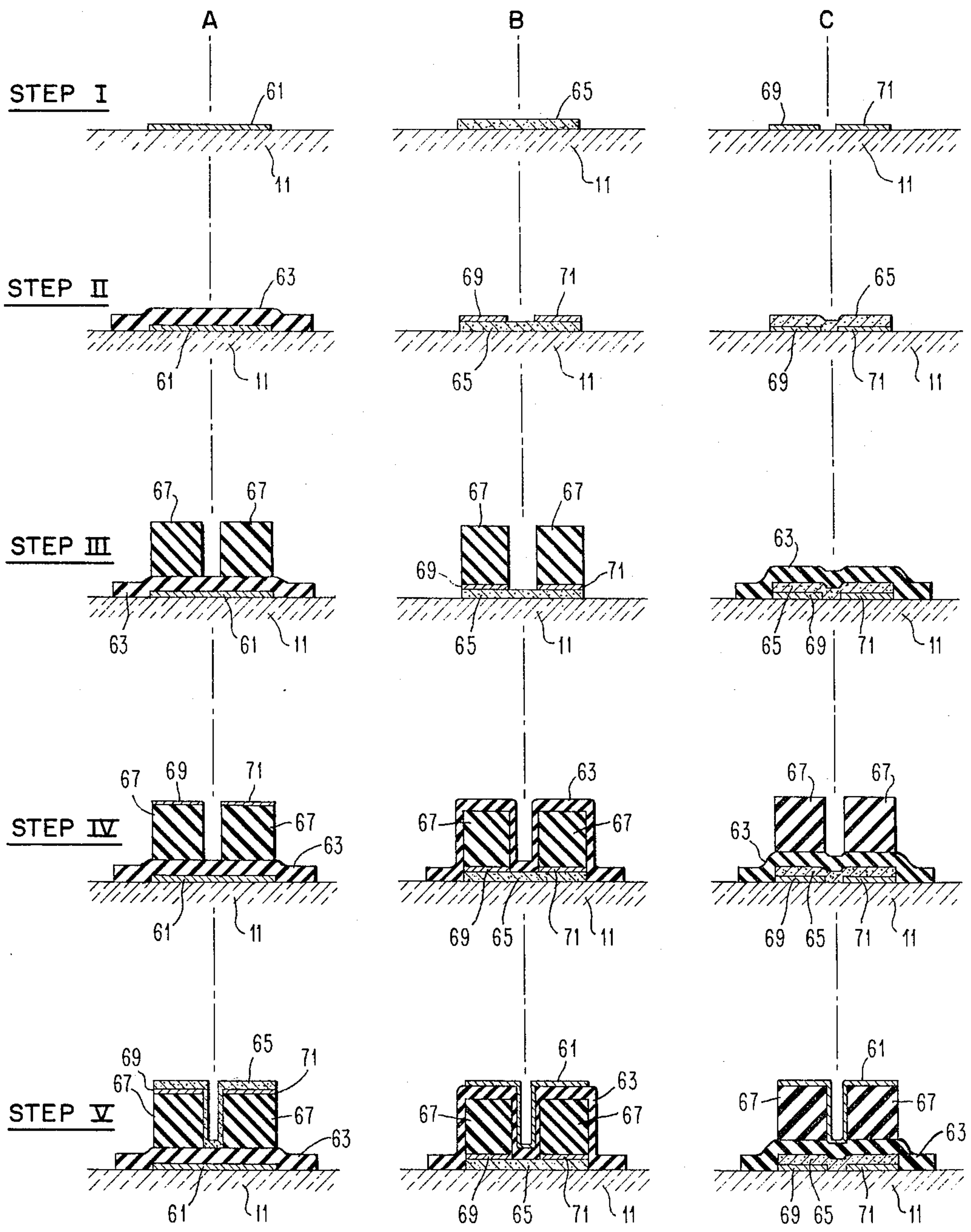

FIGS. 3A, 3B, and 3C illustrate various deposition sequences for fabricating thin film transistors in accordance with this invention.

Figure 1:
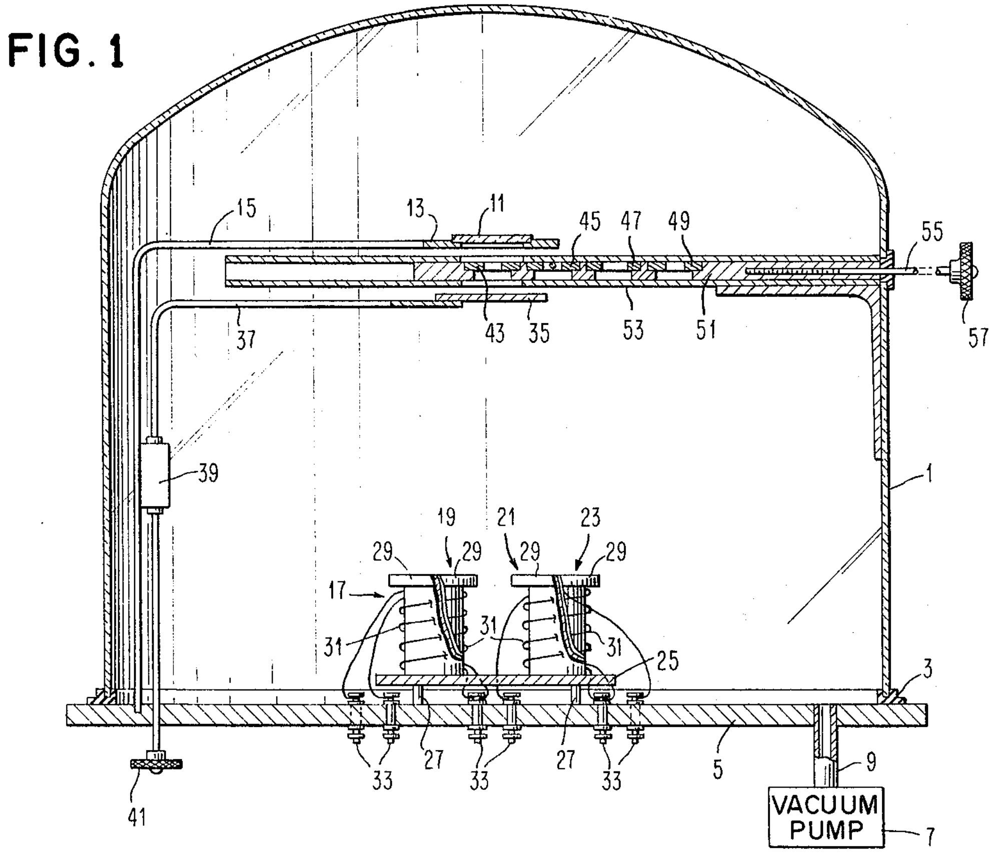
FIG. 1 is a schematic illustration of a vacuum system for effecting the novel process of this invention.

Referring to FIG. 1, a vacuum system of conventional type and suitable for effecting vapor deposition processes is illustrated. The vacuum system comprises a bell jar 1 supported in an annualar gasket 3 which rests upon a base plate 5. The interior chamber of bell jar 1 communicates with the high vacuum pump system 7 along an exhaust port 9 extending through base plate 5. Vacuum pump 7 and the seal effected between annular gasket 3 and base plate 5 cooperate to maintain sufficiently low pressures within the bell jar 1, e.g., $10^{-6}$ mm. Hg, to effect vapor deposition processes. A planar substrate 11, for example, of glass, is supported at the upper portion of bell jar 1 by holder 13; substrate holder 13 is integral with support rod 15 which is mounted in base plate 5. The thin film transistor is fabricated by the superdeposition of selected patterns of particular materials onto substrate 11. These particular materials are evaporated successively and in predetermined order in evaporation sources 17, 19, 21, and 23, respectively.

In the method of this invention, conductive material, e.g., gold, for forming each of the metallic control, gate, source, and drain electrodes is evaporated from source 17; semiconductor material, e.g., cadmium sulfide (CdS), lead sulfide (PbS), etc., for forming the active layer is evaporated from source 19; insulating material of high dielectric constant, e.g., titanium dioxide ($TiO_2$), etc., for forming a thin first dielectric layer is evaporated from source 21; and insulating material of low dielectric constant, e.g., silicon dioxide ($SiO_2$), calcium fluoride ($CaF_2$), etc., for forming a second dielectric layer is evaporated from source 23. Evaporation sources 17 through 23 are positioned in cluster fashion on deck plate 25 which is supported from base plate 5 by appropriate spacers 27; each evaporation source is positioned to direct vaporized evaporant upwardly to deposit on substrate 11. Evaporation sources 17 through 23 can be of conventional type and each essentially comprises a crucible 29 and a resistance heater 31; heaters 31 are each connected through leads 33 to a current source, not shown, disposed exterior to bell jar 1. Each heater 31 when energized, elevates the temperature of the corresponding evaporation source sufficiently to volatilize the evaporant which passes upwardly in bell jar 1 to deposit onto substrate 11. To insure uniform composition in the depositant pattern formed on substrate 11, a baffle 35 mounted on a support rod 37 is positioned over substrate 11. Support rod 37 is rotatably mounted in bearing arrangement 39 and extends through base plate 5 to a control knob 41. Baffle 35 is displaced when control knob 41 exposes substrate 11 to particular evaporants which have been volatilized at a constant source temperature.

Figure 2:
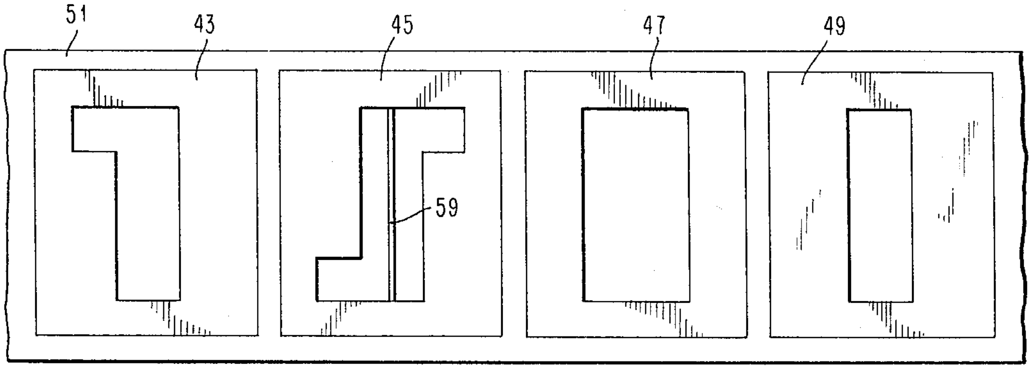
FIG. 2 is a top view of a pattern-defining mask arrangement for fabricating thin film transistors in accordance with this invention.

Particular patterns of depositant are formed onto substrate 11 by selectively positioning pattern-defining masks over substrate 11 so as to intercept selected portions of the evaporant stream. As more particularly shown in FIG. 2, the masking arrangement comprises a control gate mask 43, a source-drain mask 45, an insulation mask 47, an active layer mask 49 conventionally supported in a mask holder 51. Mask holder 51 is normally positioned in a horizontal guide member 53 supported intermediate evaporation sources 17 through 23 and substrate 11. Guide member 53 is preferably supported in near adjacency to substrate 11 to minimize shadowing of depositant patterns formed on substrate 11. Mask holder 51 is connected along connecting rod 55 to a knob 57 disposed exterior to bell jar 1 and which controls horizontal displacement of mask holder 51. When a selected pattern-defining mask is positioned over substrate 11, selected portions of the evaporant stream are intercepted so as to form a particular depositant pattern onto substrate 11.

Each pattern-defining mask 43 through 49 defines an aperture corresponding to the particular geometry of depositant to be formed on substrate 11. A consideration of control gate mask 43 and also source-drain mask 45 will make evident registration problems inherent in prior art fabrication techniques. Source-drain mask 45, for example, defines an elongated rectangular slot, for example, approximately 125 microns in width, having oppositely extending finger extensions defining source and drain land structures. A gap wire 59, for example, of approximately 8 micron diameter, is stretched taut to bisect the rectangular slot and define source and drain electrode patterns each approximately 60 microns in width. In prior art techniques, a control gate mask would define a rectangular aperture equal in width to the diameter of the gap wire and which, during deposition, had to be precisely registered in the system with the source-drain gap defined by the gap wire. Misregistration resulted in overlap of control gate electrode and source and drain electrodes and introduced spurious capacitance $C_s$. Also, misregistration reduced the overlap of the active semiconductor layer and control gate electrode which resulted in reduced transconductance $g_m$ and, thus, a lower gain-bandwidth product. In the process of this invention, however, the control gate mask 43 can define an elongated, rectangular aperture having a width substantially in excess of the diameter of gap wire 59 since precise registration requirements of the prior art techniques are avoided. As illustrated, the width of the control gate mask aperture can be, for example, fourteen microns in width or wider. In addition, insulation mask 47 and active layer mask 49 each include elongated, rectangular apertures of appropriate geometry to define the first dielectric layer, hereinafter distinguished, and the active semiconductor layer.

Particular deposition sequences for forming thin film transistors in accordance with this invention are shown in FIGS 3A, 3B, and 3C. While the deposition sequences differ, each does provide that overlapping portions of the control gate electrode and source and drain electrodes of the thin film transistor are separated by a second dielectric layer of sufficient thickness to substantially reduce capacitance $C_s$. Moreover, the material of low dielectric constant evaporated from source 23 is deposited through the source-drain mask 45 so as to be congruous with the corresponding electrodes. As hereinafter described, precise registration of the control gate electrode and the source-drain gap is not required since, due to the presence of the second dielectric layer, overlap of the former and the source and drain electrodes neither introduces spurious capacitance $C_s$ nor reduces the gain-banwidth product.

It should be noted that in the deposition sequences illustrated, a second dielectric layer is deposited through source-drain mask 45 so as to be congruous with the source and drain electrode patterns; in FIGS. 3A and 3B this second dielectric layer and the source and drain electrodes are deposited successively to avoid re-registration of the source-drain mask 45. The particular deposition sequence, however, is immaterial, and the process is considered distinguishable in that an additional insulation is deposited between overlapping portions of the control gate electrode and the source and drain electrodes. The second insulating layer can be formed of a same or of a material of lower dielectric constant as that forming first dielectric layer normally provided between the control gate electrode and the active semiconductor layer.

Referring to FIG. 3A, initial step I includes the deposition of a control gate electrode 61 onto substrate 11 by energizing the evaporation source 17 while control gate mask 43 is positioned over substrate 11. The volatilized gold (Au) evaporant passes upwardly through the control gate mask 43 and is deposited onto substrate 11 to form an electrically-continuous pattern, e.g., 200 A.

For purposes of simplicity, land structures defined by the finger extension of control gate mask 43 have not been illustrated. An advantage gained by initially depositing the control gate electrode 61 is that a separate insulation process can be effected whereby the actual deposition of the first dielectric layer 63, hereinafter described in step II, can be eliminated. For example, if control gate electrode 61 were formed, for example, of tantalum or aluminum, an anodization process would provide necessary insulation therebetween and the active semiconductor layer 65 described in step V. In the alternative step II is effected by positioning insulation mask 47 over substrate 11 and concurrently energizing evaporation source 19 to volatilize the high dielectric constant material contained therein. The dielectric material evaporated from source 19 forms a first thin dielectric layer over control gate electrode 61.

In step III of FIG. 3A, the second, or additional, dielectric layer 67 is next deposited by energizing source 23 containing a low dielectric constant material while source-drain mask 45 is positioned over substrate 11. Step III is continued so as to provide a sufficiently thick depositant 67 which, in effect, forms a trough defined by gap wire 59 over control gate electrode 61. When the second dielectric layer 67 has been formed, evaporation source 23 is de-energized to complete step III; evaporation source 17 is again energized to commence step IV and form source and drain electrodes 69 and 71. Both steps III and IV of the process are effected while source-drain mask 43 is positioned over substrate 11. Accordingly, source and drain electrodes 69 and 71 are deposited onto plateau-portions of the second dielectric layer 67; at this time, gap wire 59 intercepts portions of the gold evaporant stream to prevent deposition thereof within the trough of the second dielectric layer 67 and over the first dielectric layer 63 contained therein. Source and drain electrodes 69 and 71, therefore, are insulated from overlapping portions of control gate electrode 61 by both first and second dielectric layers 63 and 67 and spurious capacitance $C_S$ is minimal. The fabrication of the thin film transistor is completed by step V wherein evaporation source 21 is energized while active layer mask 49 is positioned over substrate 11. The volatilized semiconductor material from source 15 passes upwardly through mask 49 and deposits over portions of source and drain electrodes 69 and 71 and within the trough defined by second dielectric layer 67, as shown. In the final structure illustrated in step V, it should be noted that control gate electrode 61 and the active semiconductor layer 65 within the trough defined by the second dielectric layer 67 are separated only by first dielectric layer 63 exhibiting a relatively high dielectric constant.

Thin film transistor devices of similar structures can be formed by the deposition sequences illustrated in FIGS. 3B and 3C. For example, in FIG. 3B, active semiconductor layer 65 is initially deposited onto substrate 11 during step I of the process. Initial deposition of active semiconductor layer 65 allows for treatment processes, either during or subsequent to the deposition process, to increase grain size and thereby increase electron mobility $\mu$. As hereinabove described with respect to step V of FIG. 3A, active semiconductor layer 65 is deposited by energizing evaporation source 19 while active layer mask 49 is positioned over substrate 11. Any heat treatment of active semiconductor layer 65 is preferably effected prior to the deposition of the metallic electrode to avoid a melting of the same and contamination of the active layer at these elevated temperatures, e.g., 400° C. Successive steps for forming each of the constituent laminates of the thin film transistor are substantially identical to those hereinabove described with respect to FIG. 3A. For example, source and drain electrodes 69 and 71 are formed during step II by positioning source-drain mask 45 over substrate 11 and concurrently energizing evaporation source 17. Subsequently, and while source-drain 45 is positioned over substrate 11, evaporation source 23 is energized so as to deposit congruous patterns of low dielectric material over source and drain electrodes 69 and 71, as illustrated in step III, to form second dielectric layer 67. When second dielectric layer 67 has been thus formed, first dielectric layer 63 and also control gate electrode 61 are deposited in turn (steps IV and V) as continuous patterns over the plateau portions and within the trough of second dielectric layer 67. As above, overlapping surfaces of control gate electrode 61 and source and drain electrodes 69 and 71 are insulated one from the other by both first and second dielectric layers 63 and 67 whereby capacitance $C_S$ therebetween is substantially eliminated. In addition, second dielectric layer 67 and source and drain electrodes 69 and 71 are deposited successively through the same source-drain mask 45 so as to simplify masking procedures.

The third deposition sequence illustrated in FIG. 3C is substantially similar but for the fact that source and drain electrodes 69 and 71 and second dielectric layer 67 are not deposited successively, (c.f. steps I and IV). Accordingly, during the process of FIG. 3C, re-registration of source-drain mask 45 is required. As illustrated, source and drain electrodes 69 and 71 (step I), the active semiconductor layer 65 (step II), first dielectric layer 63 (step III), the second dielectric layer 67 (step IV), and control gate electrode 61 (step V) are deposited in turn. Albeit, first and second dielectric layers 63 and 67 are positioned intermediate overlapping portions of control gate electrode 61 and source and drain electrodes 69 and 71 to reduce the spurious capacitance $C_S$.

It should be understood, however, that the described deposition sequences are not exhaustive and that numerous other sequences can be devised within the spirit and scope of this invention. For example, it should be evident to one skilled in the art that step III and step IV of the process of FIG. 3C could be reversed and similar results achieved. In the practice of this invention, it is only requisite that overlapping portions of control gate electrode 61 and source and drain electrodes 69 and 71 be separated by a thickness of insulating material sufficient to reduce spurious capacitances $C_S$, such thickness may, but need not necessarily, include dielectric layer 63 normally provided between the control gate electrode 61 and the active semiconductor layer 65.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A thin film transistor comprising a source and drain electrode conductively joined by a layer of semiconductor material, a gate electrode positioned over said semiconductor layer and overlapping portions of said source and drain electrodes, a first dielectric layer positioned between and electrically insulating said gate electrode and said semiconductor layer, the improvement comprising a second dielectric layer intermediate overlapping portions of said source and drain electrodes and said gate electrode, respectively, to provide a capacitance between said overlapping portions less than the capacitance provided by said first dielectric layer between said gate electrode and said semiconductor layer.

2. A thin film transistor as described in claim 1 wherein said second dielectric layer exhibits a lower dielectric constant than said first dielectric layer.

3. A thin film transistor as defined in claim 1 wherein said source and drain electrodes and also said second dielectric layer are formed as adjacent laminates.

4. A thin film transistor as defined in claim 1 wherein said first dielectric layer extends between said overlapping portions of said source and drain electrodes and said gate electrode whereby said overlapping portions are electrically insulated by said first and said second dielectric layers.

5. A thin film transistor as defined in claim 1 wherein the thickness of said second dielectric layer is greater than the thickness of said first dielectric layer.

6. A method of forming a thin film transistor by vapor deposition onto a rigid substrate comprising the steps of depositing a source electrode and a drain electrode onto said substrate and through a first pattern-defining mask effective to define a source-drain gap, depositing a layer of semiconductor material conductively connecting said source and said drain electrodes and within said source-drain gap, depositing a gate electrode over said source-drain gap and overlapping portions of said source and drain electrodes, depositing first layer of dielectric material between said gate electrode and said layer of semiconductor material, and depositing a second layer of dielectric material between overlapping portions of said source and drain electrodes and said gate electrode to provide a capacitance between said overlapping portions less than the capacitance provided by said first dielectric layer between said gate electrode and semiconductor layer.

7. The method as defined in claim 6 including the further step of forming said second dielectric layer of a lower dielectric constant material than said first dielectric layer.

8. The method as defined in claim 6 including the further step of forming said second dielectric layer of a greater thickness than said first dielectric layer.

9. The method as defined in claim 6 including the further step of depositing said first dielectric layer to extend between said overlapping portions of said source and drain electrodes and said gate electrode, respectively.

10. A method as defined in claim 6 wherein said improvement further includes depositing said second dielectric layer and said source and drain electrodes through a same pattern-defining mask so as to be formed in congrous patterns.

11. A method as defined in claim 10 wherein said improvement further includes successively depositing said second dielectric layer and said source and said drain electrodes whereby said pattern defining mask remains stationary during the said successive depositions.

12. A thin film transistor device comprising a source and a drain electrode defining a source-drain gap, a layer of semiconductor material conductively connecting said source and drain electrodes within said source-drain gap, and a gate electrode electrically insulated from said semiconductive layer by a first layer of first dielectric material and overlapping portions of said source and drain electrodes, the improvement comprising a second layer of second dielectric material formed only over said source and said drain electrodes so as to be disposed between said overlapping portions of said gate electrode and said source and drain electrodes, the dielectric constant of said second material being less than that of said first dielectric material to provide a capacitance between said overlapping portions less than the capacitance between said gate electrode and said layer of semiconductor material.

13. A thin film transistor as defined in claim 12 wherein the thickness of said second layer is greater than the thickness of said first layer whereby spurious capacitance between said overlapping portions of said gate electrode and said source and drain electrodes is minimal.

References Cited by the Examiner

UNITED STATES PATENTS

| | | | |
|---|---|---|---|
| 2,566,666 | 9/1951 | Khouri | 317—101 |
| 2,804,581 | 8/1957 | Lichtgarn | 317—235 |
| 2,972,092 | 2/1961 | Nelson | 317—235 |

FOREIGN PATENTS 439,457 12/1935 Great Britain.

OTHER REFERENCES

Proceedings of the I.R.E., June 1962, pp. 1462–1469, an article by Paul K. Weimer, "The TFT—A New Thin-Film Transistor."

JOHN W. HUCKERT, *Primary Examiner.*

J. D. KALLAM, *Assistant Examiner.*